United States Patent
Yan et al.

(10) Patent No.: US 11,961,442 B2
(45) Date of Patent: Apr. 16, 2024

(54) SHIFT REGISTER UNIT, DRIVING METHOD, DRIVE CIRCUIT, AND DISPLAY APPARATUS

(71) Applicant: BOE Technology Group Co., Ltd., Beijing (CN)

(72) Inventors: Wei Yan, Beijing (CN); Wenwen Qin, Beijing (CN); Yue Shan, Beijing (CN); Deshuai Wang, Beijing (CN); Jiguo Wang, Beijing (CN); Zhen Wang, Beijing (CN); Xiaoyan Yang, Beijing (CN); Han Zhang, Beijing (CN); Jian Zhang, Beijing (CN); Yadong Zhang, Beijing (CN); Jian Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/032,512

(22) PCT Filed: Oct. 21, 2020

(86) PCT No.: PCT/CN2020/122558
§ 371 (c)(1),
(2) Date: Apr. 18, 2023

(87) PCT Pub. No.: WO2022/082519
PCT Pub. Date: Apr. 28, 2022

(65) Prior Publication Data
US 2023/0395008 A1    Dec. 7, 2023

(51) Int. Cl.
*G09G 3/20* (2006.01)
*G11C 19/28* (2006.01)

(52) U.S. Cl.
CPC ........... *G09G 3/20* (2013.01); *G11C 19/28* (2013.01); *G09G 2310/0286* (2013.01)

(58) Field of Classification Search
CPC ... G09G 3/20; G09G 2310/0286; G11C 19/28
See application file for complete search history.

(56) References Cited

U.S. PATENT DOCUMENTS

| 2006/0044247 | A1  | 3/2006 | Jang et al. |
| 2014/0270050 | A1* | 9/2014 | Wang ............... G11C 19/28 377/67 |
| 2019/0004114 | A1* | 1/2019 | Sun ............ G01R 31/318536 |

FOREIGN PATENT DOCUMENTS

| CN | 109785787 A | 5/2019 |
| CN | 109872699 A | 6/2019 |

(Continued)

OTHER PUBLICATIONS

PCT/CN2020/122558 international search report.

*Primary Examiner* — Peter D McLoone
(74) *Attorney, Agent, or Firm* — IPro, PLLC

(57) ABSTRACT

A shift register unit, a driving method, a drive circuit, and a display apparatus are disclosed. The shift register unit includes: a control circuit, which is configured to adjust signals of a first node and a second node according to an input signal end, a first control signal end, a second control signal end and a first reference signal end; a cascade circuit, which is configured to provide, according to the signal of the first node, a signal of a first cascade clock signal end to a cascade output end; and an output circuit, which is configured to provide, according to the signal of the first node, a signal of a control clock signal end to a drive output end, and provide, according to the signal of the second node, a signal of a second reference signal end to the drive output end.

15 Claims, 10 Drawing Sheets

(56) References Cited

FOREIGN PATENT DOCUMENTS

| | | |
|---|---|---|
| CN | 111312322 A | 6/2020 |
| CN | 111653228 A | 9/2020 |
| CN | 111710281 A | 9/2020 |

\* cited by examiner

SHIFT REGISTER UNIT, DRIVING METHOD, DRIVE CIRCUIT, AND DISPLAY APPARATUS This application is a National Stage of International Application No. PCT/CN2020/122558, filed on Oct. 21, 2020, which is hereby incorporated by reference in its entirety.

FIELD

The present disclosure relates to the field of display technology, and particularly to a shift register unit, a driving method, a drive circuit, and a display apparatus.

BACKGROUND

As display technology is being rapidly developed, display apparatuses are increasingly being developed toward high integration and low cost. GOA (Gate Driver on Array) technology integrates a TFT (Thin Film Transistor) drive circuit on an array substrate of a display apparatus to form a scan drive for the display apparatus. The drive circuit generally includes a plurality of cascaded shift registers. However, output of the shift register is unstable, resulting in abnormal display.

SUMMARY

An embodiment of the present disclosure provides a shift register unit, including:
- a control circuit, electrically connected to an input signal end, a reset signal end, a first control signal end, a second control signal end, a first reference signal end, a first node, and a second node respectively, and configured to a signal of the first node and a signal of the second node according to the input signal end, the first control signal end, the second control signal end, and the first reference signal end;
- a cascade circuit, electrically connected to a first cascade clock signal end, the first node, and a cascade output end respectively, and configured to provide a signal of the first cascade clock signal end to the cascade output end according to the signal of the first node; and
- an output circuit, electrically connected to a control clock signal end, the first node, the second node, a second reference signal end, and a drive output end respectively, and configured to provide a signal of the control clock signal end to the drive output end according to the signal of the first node, and to provide a signal of the second reference signal end to the drive output end according to the signal of the second node.

In some embodiments, the output circuit includes: a first transistor and a second transistor;
- a gate of the first transistor is electrically connected to the first node, a first end of the first transistor is electrically connected to the control clock signal end, and a second end of the first transistor is electrically connected to the drive output end; and
- a gate of the second transistor is electrically connected to the second node, a first end of the second transistor is electrically connected to the second reference signal end, and a second end of the second transistor is electrically connected to the drive output end.

In some embodiments, the output circuit further includes: a third transistor and a fourth transistor;
- a gate of the third transistor is electrically connected to a regulation signal end, a first end of the third transistor is electrically connected to the second end of the first transistor, and a second end of the third transistor is electrically connected to the drive output end; and
- a gate of the fourth transistor is electrically connected to the regulation signal end, a first end of the fourth transistor is electrically connected to the second end of the second transistor, and a second end of the fourth transistor is electrically connected to the drive output end.

In some embodiments, the cascade circuit includes: a fifth transistor and a storage capacitor;
- a gate of the fifth transistor is electrically connected to the first node, a first end of the fifth transistor is electrically connected to the first cascade clock signal end, a second end of the fifth transistor is electrically connected to the cascade output end; and
- a first end of the storage capacitor is electrically connected to the first node, and the storage capacitor is electrically connected to the cascade output end.

In some embodiments, the shift register unit further includes: a sixth transistor;
- a gate of the sixth transistor is electrically connected to the drive output end, a first end of the sixth transistor is electrically connected to the first reference signal end, and a second end of the sixth transistor is electrically connected to the second node.

In some embodiments, the control circuit includes:
- an input circuit, electrically connected to the input signal end, the first control signal end, and an intermediate node respectively, and configured to provide a signal of the first control signal end to the intermediate node under control of a signal of the input signal end;
- a reset circuit, electrically connected to the reset signal end, the second control signal end, and the intermediate node respectively, and configured to provide a signal of the second control signal end to the intermediate node under control of a signal of the reset signal end;
- a node adjustment circuit, electrically connected to the first reference signal end, a second cascade clock signal end, the second node, and the intermediate node respectively, and configured to provide a signal of the first reference signal end to the second node under control of a signal of the intermediate node, and to provide the signal of the first reference signal end to the intermediate node under control of a signal of the second cascade clock signal end and the signal of the second node; and
- a stabilization circuit, electrically connected to the intermediate node, the first node, and a regulation signal end respectively, and configured to conduct the intermediate node and the first node under control of a signal of a regulation signal end.

In some embodiments, the input circuit includes: a seventh transistor;
- a gate of the seventh transistor is electrically connected to the input signal end, a first end of the seventh transistor is electrically connected to the first control signal end, and a second end of the seventh transistor is electrically connected to the intermediate node.

In some embodiments, the reset circuit includes: an eighth transistor;
- a gate of the eighth transistor is electrically connected to the reset signal end, a first end of the eighth transistor is electrically connected to the second control signal end, and a second end of the eighth transistor is electrically connected to the intermediate node.

In some embodiments, the node adjustment circuit includes: a ninth transistor, a tenth transistor, an eleventh transistor, and a stabilizing capacitor;

a gate of the ninth transistor is electrically connected to the intermediate node, a first end of the ninth transistor is electrically connected to the first reference signal end, and a second end of the ninth transistor is electrically connected to the second node;

a gate and a first end of the tenth transistor are both electrically connected to the second cascade clock signal end, and a second end of the tenth transistor is electrically connected to the second node;

a gate of the eleventh transistor is electrically connected to the second node, a first end of the eleventh transistor is electrically connected to the first reference signal end, and a second end of the eleventh transistor is electrically connected to the intermediate node; and a first end of the stabilizing capacitor is electrically connected to the second node and a second end of the stabilizing capacitor is electrically connected to the first reference signal end.

In some embodiments, the stabilization circuit includes: a twelfth transistor;

a gate of the twelfth transistor is electrically connected to the regulation signal end, a first end of the twelfth transistor is electrically connected to the intermediate node, and a second end of the twelfth transistor is electrically connected to the first node.

In some embodiments, the shift register unit further includes: a thirteenth transistor and a fourteenth transistor;

a gate of the thirteenth transistor is electrically connected to a frame reset signal end, a first end of the thirteenth transistor is electrically connected to the first reference signal end, and a second end of the thirteenth transistor is electrically connected to an intermediate node; and a gate of the fourteenth transistor is electrically connected to a touch control end, a first end of the fourteenth transistor is electrically connected to the second reference signal end, and a second end of the fourteenth transistor is electrically connected to the drive output end.

Embodiments of the present disclosure provide a drive circuit, including: a plurality of cascaded shift register units described above;

an input signal end of a first-stage shift register unit is electrically connected to a frame trigger signal end; and in adjacent two-stage shift register units, an input signal end of a lower-stage shift register unit is electrically connected to a cascade output end of an upper-stage shift register unit, and a reset signal end of the upper-stage shift register unit is electrically connected to a cascade output end of the lower-stage shift register unit.

An embodiment of the present disclosure provides a display apparatus, including the drive circuit.

In some embodiments, the display apparatus further includes: a plurality of gate lines; and one of the gate lines is electrically connected to a drive output end of one of the shift register units in the drive circuit.

In some embodiments, the display apparatus further includes: a plurality of gate lines and a gate scan circuit; and the drive circuit is electrically connected to gate lines spaced apart by one gate line, and the gate scan circuit is electrically connected to remaining gate lines.

DETAILED DESCRIPTION OF EMBODIMENTS

Figure 1:
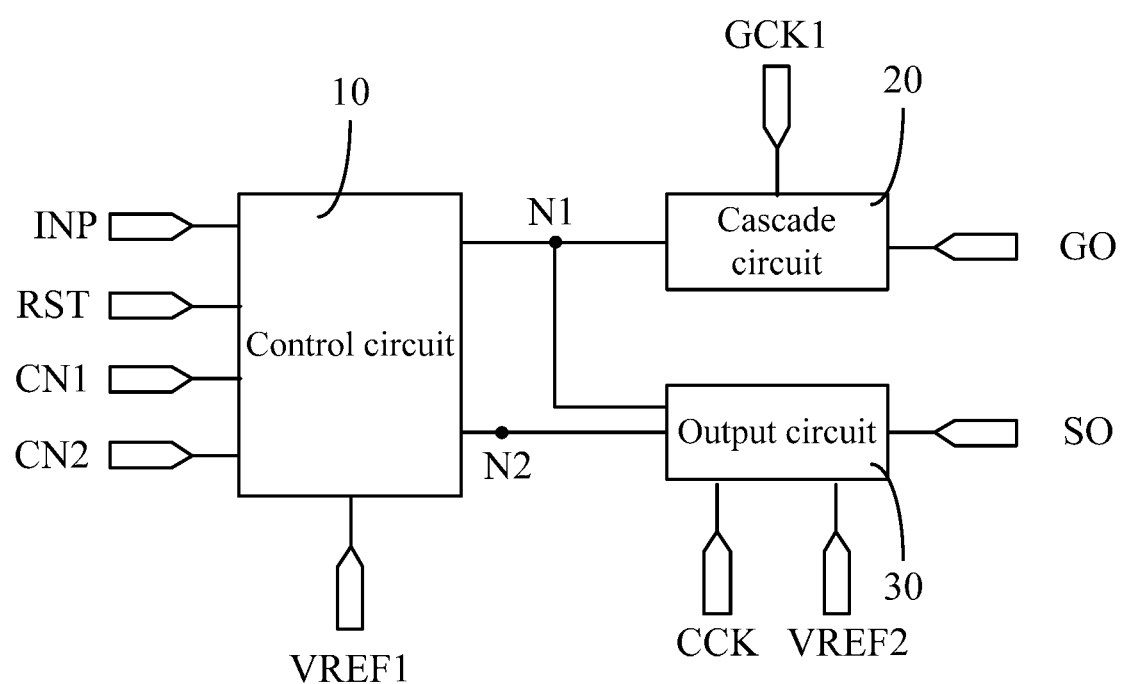
FIG. 1 is a schematic structural diagram of a shift register according to an embodiment of the present disclosure.

In order to make objectives, solutions and advantages of embodiments of the present disclosure clearer, solutions of embodiments of the present disclosure will be clearly and completely described below in conjunction with the accompanying drawings of embodiments of the present disclosure. Clearly, the described embodiments are some, but not all, embodiments of the present disclosure. Embodiments and features of embodiments in the present disclosure may be combined with each other without conflict. Based on the described embodiments of the present disclosure, all other embodiments obtained by a person of ordinary skill in the art without inventive effort fall within the scope of protection of the present disclosure.

Unless otherwise defined, technical or scientific terms used in the present disclosure shall have a general meaning as understood by a person of ordinary skill in the art to which the present disclosure belongs. The terms "first," "second," and the like, as used in this disclosure, do not denote any order, quantity, or importance, but are merely used to distinguish one component from another. The word "including" or "comprising" and the like means that elements or items preceding the word appear to encompass elements or items listed after the word and equivalents thereof, but not to the exclusion of other elements or items. "Connecting" or "connected" and the like are not restricted to physical or mechanical connections, but can include electrical connections, whether direct or indirect.

It should be noted that sizes and shapes of the figures in the drawings do not reflect a true scale, but are merely illustrative of the disclosure, and the same or similar reference numerals throughout refer to the same or similar elements or elements having the same or similar function.

A shift register unit according to embodiments of the present disclosure, as shown in FIG. 1, can include: a control circuit 10, electrically connected to an input signal end INP, a reset signal end RST, a first control signal end CN1, a second control signal end CN2, a first reference signal end VREF1, a first node N1, and a second node N2 respectively, and configured to adjust a signal of the first node N1 and a signal of the second node N2 according to the input signal end INP, the first control signal end CN1, the second control signal end CN2, and the first reference signal end VREF1; a cascade circuit 20, electrically connected to a first cascade clock signal end GCK1, the first node N1, and a cascade output end GO respectively, and configured to provide a signal of the first cascade clock signal end GCK1 to the cascade output end GO according to the signal of the first node N1; and an output circuit 30, electrically connected to a control clock signal end CCK, the first node N1, the second node N2, a second reference signal end VREF2, and a drive output end SO respectively, and configured to provide a signal of the control clock signal end CCK to the drive output end SO according to the signal of the first node N1, and to provide a signal of the second reference signal end VREF2 to the drive output end SO according to the signal of the second node N2.

Figure 2:
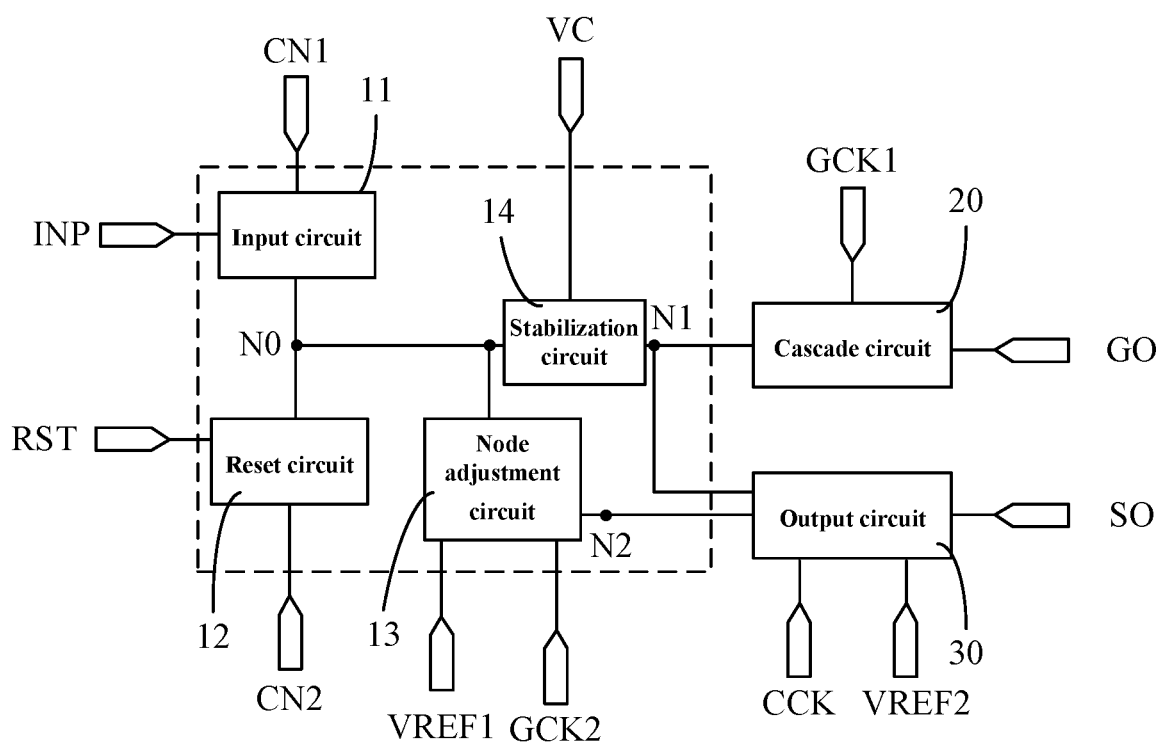
FIG. 2 is another schematic structural diagram of the shift register according to an embodiment of the present disclosure.

In some embodiments, in specific implementation, as shown in FIG. 2, the control circuit 10 may include: an input circuit 11, electrically connected to the input signal end INP, the first control signal end CN1, and an intermediate node N0 respectively, and configured to provide a signal of the first control signal end CN1 to the intermediate node N0 under control of a signal of the input signal end INP; a reset circuit 12, electrically connected to the reset signal end RST, the second control signal end CN2, and the intermediate node N0 respectively, and configured to provide a signal of the second control signal end CN2 to the intermediate node N0 under control of a signal of the reset signal end RST; a node adjustment circuit 13, electrically connected to the first reference signal end VREF1, a second cascade clock signal end, the second node N2, and the intermediate node N0 respectively, and configured to provide a signal of the first reference signal end VREF1 to the second node N2 under control of a signal of the intermediate node N0, and to provide the signal of the first reference signal end VREF1 to the intermediate node N0 under control of a signal of the second cascade clock signal end and the signal of the second node N2; and a stabilization circuit 14, electrically connected to the intermediate node N0, the first node N1, and a regulation signal end VC respectively, and configured to conduct the intermediate node N0 and the first node N1 under control of a signal of a regulation signal end VC.

Figure 3:
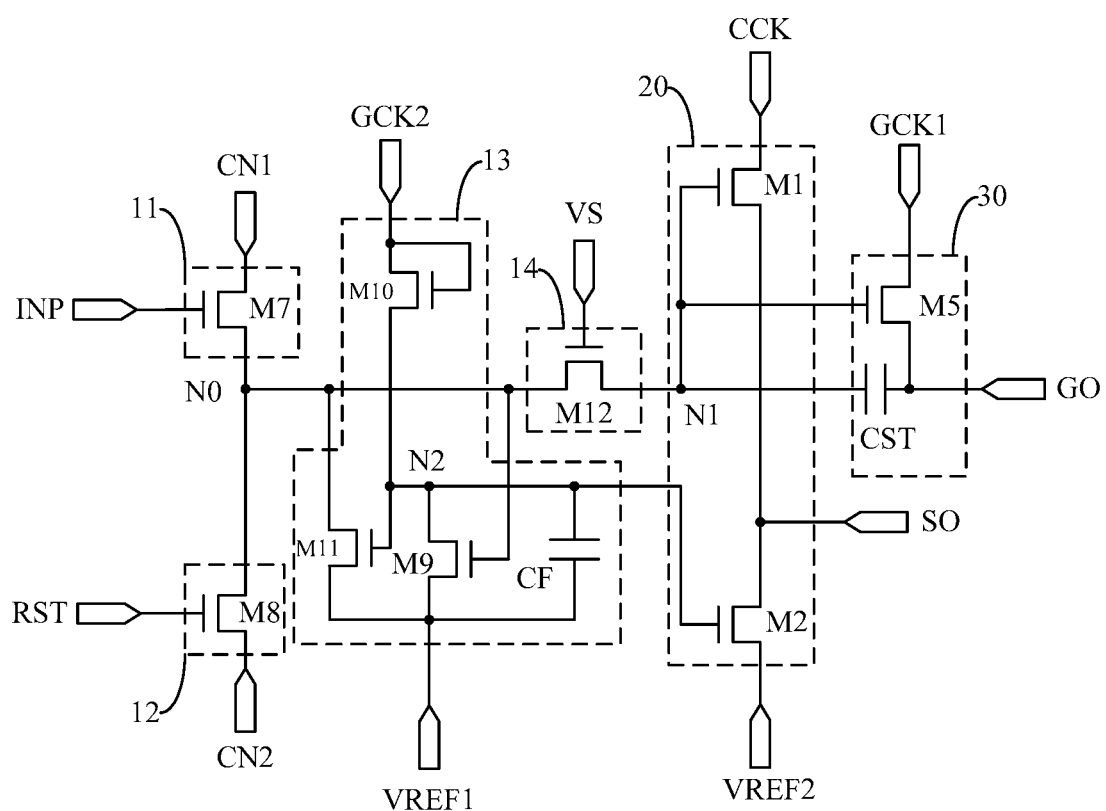
FIG. 3 is yet another schematic structural diagram of the shift register according to an embodiment of the present disclosure.

In some embodiments, in specific implementation, as shown in FIG. 3, the input circuit 11 may include: a seventh transistor M7; a gate of the seventh transistor M7 is electrically connected to the input signal end INP, a first end of the seventh transistor M7 is electrically connected to the first control signal end CN1, and a second end of the seventh transistor M7 is electrically connected to the intermediate node N0.

In some embodiments, in specific implementation, as shown in FIG. 3, the reset circuit 12 may include: an eighth transistor M8; a gate of the eighth transistor M8 is electrically connected to the reset signal end RST, a first end of the eighth transistor M8 is electrically connected to the second control signal end CN2, and a second end of the eighth transistor M8 is electrically connected to the intermediate node N0.

In some embodiments, in specific implementation, as shown in FIG. 3, the node adjustment circuit 13 may include: a ninth transistor M9 and a tenth transistor M10; a gate of the ninth transistor M9 is electrically connected to the intermediate node N0, a first end of the ninth transistor M9 is electrically connected to the first reference signal end VREF1, and a second end of the ninth transistor M9 is electrically connected to the second node N2; a gate and a first end of the tenth transistor M10 are both electrically connected to the second cascade clock signal end, and a second end of the tenth transistor M10 is electrically connected to the second node N2; and a gate of the eleventh transistor M11 is electrically connected to the second node N2, a first end of the eleventh transistor M11 is electrically connected to the first reference signal end VREF1, and a second end of the eleventh transistor M11 is electrically connected to the intermediate node N0.

In some embodiments, in specific implementation, as shown in FIG. 3, the stabilization circuit 14 may include: a twelfth transistor M12; a gate of the twelfth transistor M12 is electrically connected to the regulation signal end VC, a first end of the twelfth transistor M12 is electrically connected to the intermediate node N0, and a second end of the twelfth transistor M12 is electrically connected to the first node N1.

In some embodiments, in specific implementation, as shown in FIG. 3, the output circuit 30 may include: a first transistor M1 and a second transistor M2; a gate of the first transistor M1 is electrically connected to the first node N1, a first end of the first transistor M1 is electrically connected to the control clock signal end CCK, and a second end of the first transistor M1 is electrically connected to the drive output end SO; and a gate of the second transistor M2 is electrically connected to the second node N2, a first end of the second transistor M2 is electrically connected to the second reference signal end VREF2, and a second end of the second transistor M2 is electrically connected to the drive output end SO.

In some embodiments, in specific implementation, as shown in FIG. 3, the cascade circuit 20 includes: a fifth transistor M5 and a storage capacitor; a gate of the fifth transistor M5 is electrically connected to the first node N1, a first end of the fifth transistor M5 is electrically connected to the first cascade clock signal end GCK1, and a second end of the fifth transistor M5 is electrically connected to the cascade output end GO; and a first end of the storage capacitor is electrically connected to the first node N1, and the storage capacitor is electrically connected to the cascade output end GO.

In specific implementation, according to a direction of flow of the signal, a first end of a transistor may serve as a source of the transistor and a second end of the transistor may serve as a drain of the transistor; alternatively, the first end of the transistor serves as the drain of the transistor and the second end of the transistor serves as the source of the transistor, without specific distinction here.

It should be noted that the transistors mentioned in the above embodiments of the present disclosure may be TFTs or may be Metal Oxide Semiconductors (MOS), which is not limited here.

To simplify the fabrication process, in specific implementation, in embodiments of the present disclosure, as shown in FIG. 3, all transistors may be N-type transistors. The N-type transistor is turned on when a voltage difference $V_{gs}$ between a gate and a source of the N-type transistor and a threshold voltage $V_{th}$ of the N-type transistor satisfy a relationship $V_{gs} > V_{th}$. For example, the twelfth transistor M12 may be an N-type transistor, then the twelfth transistor M12 is turned on when the relationship between a voltage difference $V_{gs1}$ between the gate and the source of the twelfth transistor and a threshold voltage $V_{th1}$ of the twelfth transistor satisfies a formula: $V_{gs1} > V_{th1}$. Of course, in embodiments of the present disclosure, only examples of the transistor being an N-type transistor are described, and for the case of the transistor being a P-type transistor, the design principle is the same as the present disclosure, and belongs to the scope of protection of the present disclosure. Further, the P-type transistor is turned on when the voltage difference $V_{gs}$ between a gate and a source of the P-type transistor and a threshold voltage $V_{th}$ of the P-type transistor satisfy a relationship $V_{gs} < V_{th}$. For example, the twelfth transistor M12 may be a P-type transistor that is turned on when the relationship between the voltage difference $V_{gs1}$ between the gate and the source of the twelfth transistor and the threshold voltage $V_{th1}$ of the twelfth transistor satisfies a formula: $V_{gs1} < V_{th1}$.

Further, in specific implementation, the P-type transistor is turned off by a high-level signal and turned on by a low-level signal. The N-type transistor is turned on by a high-level signal and turned off by a low-level signal.

The above are merely examples of the specific structure of the shift register unit according to the present embodiment, and the specific structure of each of the above circuits is not limited to the above structure according to the present embodiment and may be other structures apparent to those skilled in the art in specific implementation, which is not limited here.

The operation of the shift register unit according to an embodiment of the present disclosure is described below with reference to the signal timing diagram shown in FIG. 4 by taking the shift register unit shown in FIG. 3 as an example. In the following description, 1 represents a high-level signal and 0 represents a low-level signal, it should be noted that 1 and 0 are logic levels, which are provided only to better explain the specific operation of embodiments of the present disclosure, and not the voltages applied to gates of the transistors in specific implementation.

Figure 4:
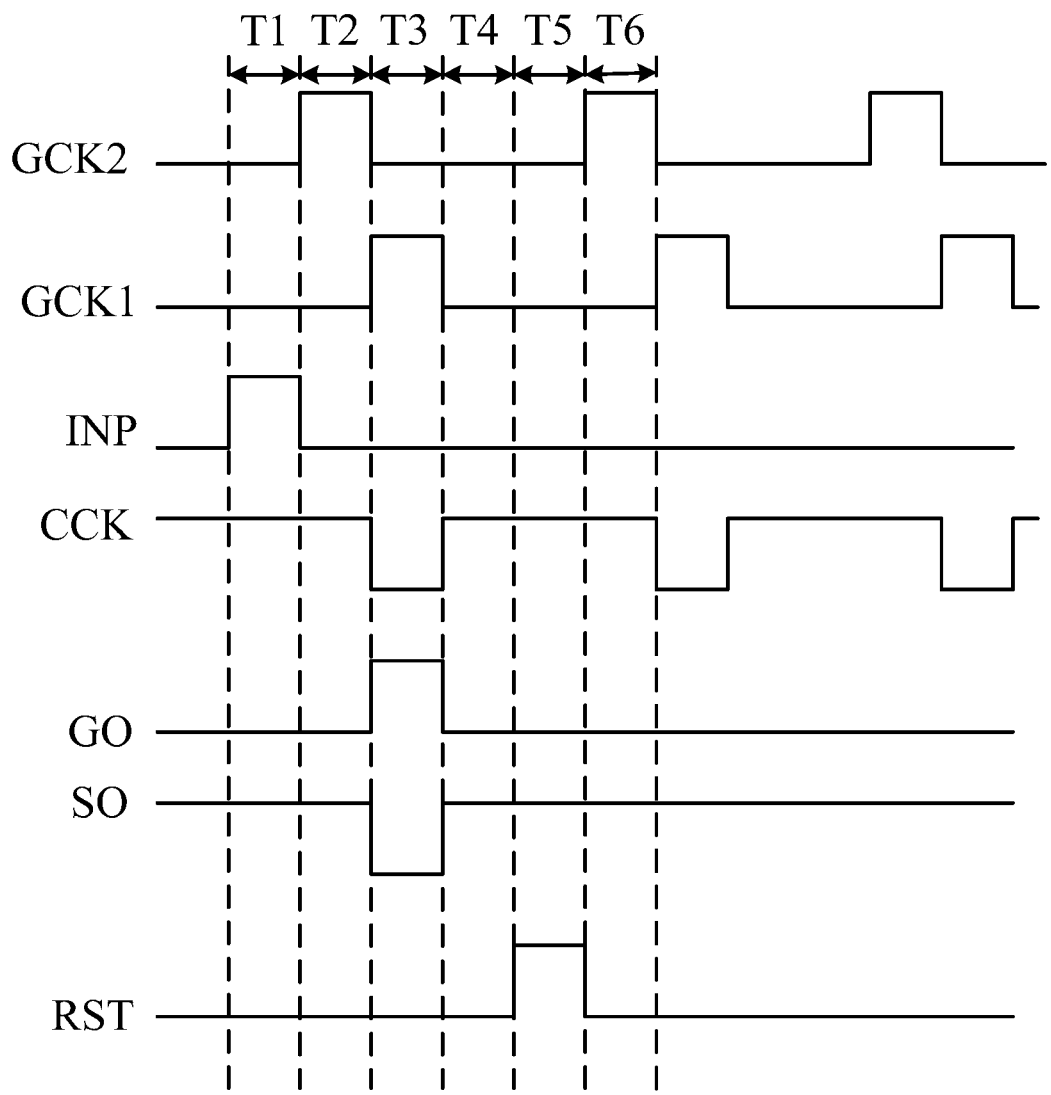
FIG. 4 is a signal timing diagram according to an embodiment of the present disclosure.

Six phases T1, T2, T3, T4, T5, and T6 in the signal timing diagram shown in FIG. 4 are chosen. It should be noted that the signal timing diagram shown in FIG. 4 is only an operation process of one shift register unit in one display frame. The working process of the shift register unit in other display frames is basically the same as that in the display frame, which is not repeated herein. The signal at the first reference signal end VREF1 is a low-level signal, the signal at the second reference signal end VREF2 is a high-level signal, and the regulation signal end VC is a high-level signal. A signal at the first control signal end CN1 is a high-level signal, and a signal at the second control signal end CN2 is a low-level signal.

In a T1 phase, GCK2=0, GCK1=0, INP=1, CCK=1, RST=0.

Since INP=1, the seventh transistor M7 is turned on to provide the signal of the first control signal end CN1 to the intermediate node N0 to make the intermediate node N0 as a high-level signal so that the ninth transistor M9 may be controlled to be turned on. The turned-on ninth transistor M9 provides the signal of the first reference signal end VREF1 to the second node N2 so that the signal of the second node N2 is a low-level signal, and the eleventh transistor M11 and the second transistor M2 may be controlled to be turned off. The twelfth transistor M12 is turned on under the control of the high-level signal at the regulation signal end VC to conduct the intermediate node N0 and the first node N1, thus causing the signal of the first node N1 to be a high-level signal, and further controlling the first transistor M1 and the fifth transistor M5 to be turned on. The turned-on first transistor M1 provides the high-level signal at the control clock signal end CCK to the drive output end SO, causing the drive output end SO to output the high-level signal. The turned-on fifth transistor M5 provides the low-level signal at the first cascade clock signal end GCK1 to the cascade output end GO, causing the cascade output end GO to output a low-level signal.

In a T2 phase, GCK2=1, GCK1=0, INP=0, CCK=1, RST=0.

Since INP=0, the seventh transistor M7 is turned off. Due to the effect of the storage capacitor, the signal of the first node N1 may be kept at a high level, thereby controlling the first transistor M1 and the fifth transistor M5 to be turned on. The turned-on first transistor M1 provides the high-level signal at the control clock signal end CCK to the drive output end SO, causing the drive output end SO to output the high-level signal. The turned-on fifth transistor M5 provides the low-level signal of the first cascade clock signal end GCK1 to the cascade output end GO, causing the cascade output end GO to output a low-level signal. Besides, the intermediate node N0 is a high-level signal so that the ninth transistor M9 may be controlled to be turned on. The turned-on ninth transistor M9 provides the signal of the first reference signal end VREF1 to the second node N2 so that the signal of the second node N2 is a low-level signal, and the eleventh transistor M11 and the second transistor M2 may be controlled to be turned off.

In a T3 phase, GCK2=0, GCK1=1, INP=0, CCK=0, RST=0.

Since INP=0, the seventh transistor M7 is turned off. Due to the effect of the storage capacitor, the signal of the first node N1 may be kept at a high level, thereby controlling the first transistor M1 and the fifth transistor M5 to be turned on. The turned-on fifth transistor M5 provides the high-level signal of the first cascade clock signal end GCK1 to the cascade output end GO, causing the cascade output end GO to output a high-level signal. Due to the effect of the storage capacitor, the level of the first node N1 may be pulled further high, so that the first transistor M1 and the fifth transistor M5 may be turned on as completely as possible. The turned-on first transistor M1 then provides the low-level signal at the control clock signal end CCK to the drive output end SO, causing the drive output end SO to output the low-level signal. The turned-on fifth transistor M5 provides the high-level signal of the first cascade clock signal end GCK1 to the cascade output end GO, causing the cascade output end GO to output a high-level signal. Since the signal of the first node N1 is pulled further high, the twelfth transistor M12 is turned off. Besides, the intermediate node N0 is a high-level signal so that the ninth transistor M9 may be controlled to be turned on. The turned-on ninth transistor M9 provides the signal of the first reference signal end VREF1 to the second node N2 so that the signal of the second node N2 is a low-level signal, and the eleventh transistor M11 and the second transistor M2 may be controlled to be turned off.

In a T4 phase, GCK2=0, GCK1=0, INP=0, CCK=1, RST=0.

Since INP=0, the seventh transistor M7 is turned off. Due to the effect of the storage capacitor, the signal of the first node N1 may be kept at a high level, thereby controlling the first transistor M1 and the fifth transistor M5 to be turned on. The turned-on fifth transistor M5 provides the low-level signal of the first cascade clock signal end GCK1 to the cascade output end GO, causing the cascade output end GO to output a low-level signal. The turned-on first transistor M1 provides the high-level signal at the control clock signal end CCK to the drive output end SO, causing the drive output end SO to output the high-level signal. Besides, the intermediate node N0 is a high-level signal so that the ninth transistor M9 may be controlled to be turned on. The turned-on ninth transistor M provides the signal of the first reference signal end VREF1 to the second node N2 so that the signal of the second node N2 is a low-level signal, and the eleventh transistor M11 and the second transistor M2 may be controlled to be turned off.

In a T5 phase, GCK2=0, GCK1=0, INP=0, CCK=1, RST=1.

Since INP=0, the seventh transistor M7 is turned off. Since RST=1, the eighth transistor M8 is turned on to provide the low-level signal of the second control signal end CN2 to the intermediate node N0, and the twelfth transistor M12 is turned on under the control of the high-level signal of the regulation signal end VC to conduct the intermediate node N0 and the first node N1, causing the signal of the first node N1 to be a low-level signal, and controlling the first transistor M1 and the fifth transistor M5 to be turned off. The drive output end SO holds a high-level signal output, and the cascade output end GO holds a low-level signal output.

In a T6 phase, GCK2=1, GCK1=0, INP=0, CCK=1, RST=0.

Since INP=0, the seventh transistor M7 is turned off. Since RST=0, the eighth transistor M8 is turned off. Since GCK2=1, the tenth transistor M10 is turned on to provide the high-level signal of the second cascade clock signal end to the second node N2, so that the signal of the second node N2 is at a high level to control the eleventh transistor M11 and the second transistor M2 to be turned on. The turned-on eleventh transistor M11 provides the low-level signal of the first reference signal end VREF1 to the intermediate node N0 so that the signal of the intermediate node N0 is a low-level signal, then the first transistor M1 and the fifth transistor M5 are turned off. The turned-on second transistor M2 provides the high-level signal of the second reference signal end VREF2 to the drive output end SO, causing the drive output end SO to output the high-level signal. Besides, the cascade output end GO maintains a low-level signal output.

Figure 5:
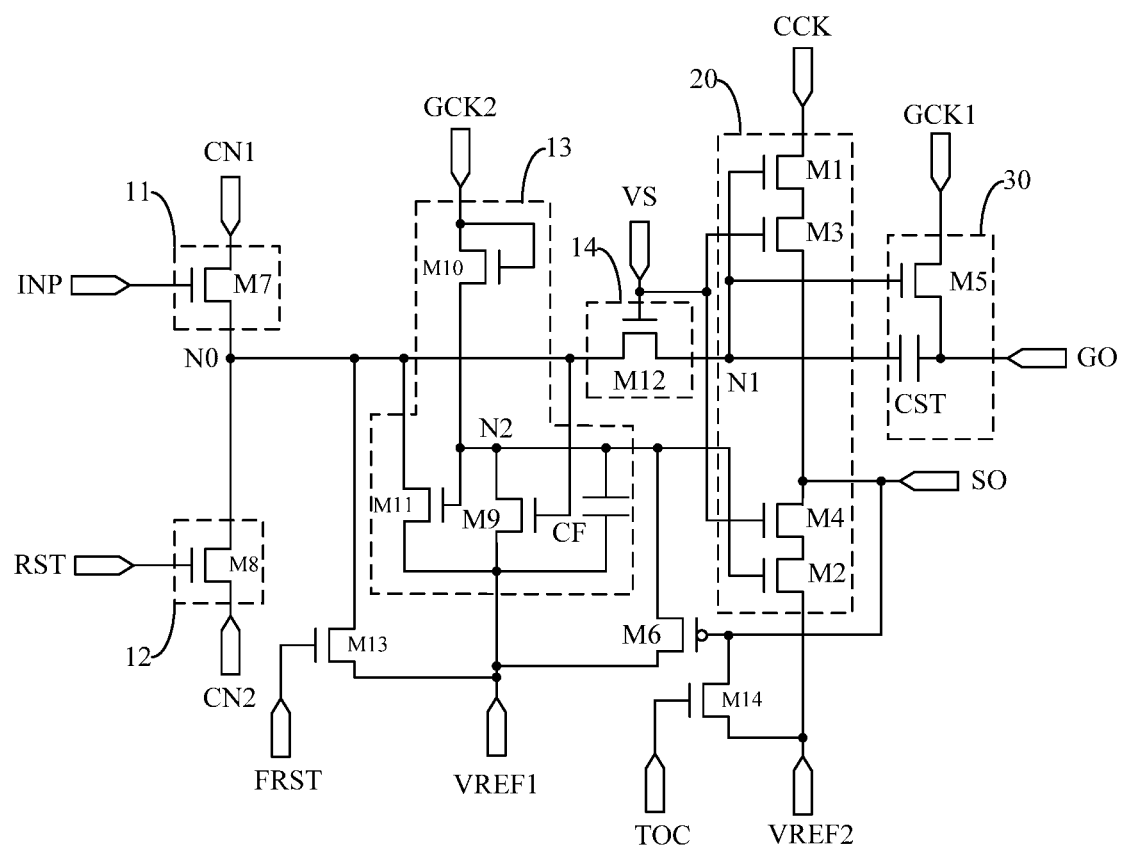
FIG. 5 is yet another schematic structural diagram of the shift register according to an embodiment of the present disclosure.

Embodiments of the present disclosure also provide another shift register unit, a schematic structural diagram of the shift register unit is as shown in FIG. 5, which is modified for implementation in embodiments described above. Only differences of the present embodiment from the above-described embodiments will now be described, and the same will not be repeated here.

In some embodiments, in specific implementation, as shown in FIG. 5, the output circuit 30 may further include: a third transistor M3 and a fourth transistor M4. A gate of the third transistor M3 is electrically connected to the regulation signal end VC, a first end of the third transistor M3 is electrically connected to the second end of the first transistor M1, and a second end of the third transistor M3 is electrically connected to the drive output end SO; a gate of the fourth transistor M4 is electrically connected to the regulation signal end VC, a first end of the fourth transistor M4 is electrically connected to a second end of the second transistor M2, and a second end of the fourth transistor M4 is electrically connected to the drive output end SO.

In application, when the drive output end SO is outputting, the first transistor M1 may couple out a noise voltage through the first node N1, the noise voltage is superimposed on the drive output end SO and may have an effect on the drive output end SO. By providing the third transistor M3, the shift register unit according to an embodiment of the present disclosure can eliminate the noise voltage of the first transistor M1 coupled out from the first node N1 and improve output stability at the drive output end SO.

In application, when the drive output end SO is outputting, the second transistor M2 may couple out a noise voltage through the second node N2, the noise voltage is superimposed on the drive output end SO and may have an effect on the drive output end SO. By providing the fourth transistor M4, the shift register unit according to an embodiment of the present disclosure can eliminate the noise voltage of the second transistor M2 coupled out from the second node N2 and improve the output stability at the drive output end SO.

In some embodiments, in specific implementation, as shown in FIG. 5, the shift register unit may further include: a sixth transistor M6; a gate of the sixth transistor M6 is electrically connected to the drive output end SO, a first end of the sixth transistor M6 is electrically connected to the first reference signal end VREF1, and a second end of the sixth transistor M6 is electrically connected to the second node N2. For example, the sixth transistor M6 may be a P-type transistor. Besides, the sixth transistor M6 is arranged to be turned on when the signal of the drive output end SO is the low-level signal, so that the low-level signal of the first reference signal end VREF1 is provided to the second node N2 to further stabilize the signal of the second node N2 to the low-level signal.

In some embodiments, in specific implementation, as shown in FIG. 5, the shift register unit may further include: a thirteenth transistor M13 and a fourteenth transistor M14. A gate of the thirteenth transistor M13 is electrically connected to a frame reset signal end RST, a first end of the thirteenth transistor M13 is electrically connected to the first reference signal end VREF1, and a second end of the thirteenth transistor M13 is electrically connected to the intermediate node N0; a gate of a fourteenth transistor M14 is electrically connected to a touch control end, a first end of the fourteenth transistor M14 is electrically connected to the second reference signal end VREF2 and a second end of the fourteenth transistor M14 is electrically connected to the drive output end SO.

In practical applications, a Blacking Time is set between two adjacent display frames, the thirteenth transistor M13 may be controlled to be turned on by the frame reset signal end RST to stabilize the signal of the intermediate node N0 to the low-level signal, thereby improving the output stability of the shift register unit.

In practical applications, not only a display function but also a touch function may be realized in a display apparatus. In specific implementation, the display function and the touch function may be performed in a time-sharing manner, and thus, the fourteenth transistor M14 may be controlled to be turned off by the touch control end when the display apparatus implements the display function. The fourteenth transistor M14 may be controlled to be turned on by the touch control end when the display apparatus implements the touch function to supply the high-level signal of the second reference signal end VREF2 to the drive output end SO, so that the drive output end SO outputs the high-level signal.

It should be noted that in the above embodiment, the sixth transistor M6 may be a P-type transistor and remaining transistors may be N-type transistors, which is not limited here.

Figure 6:
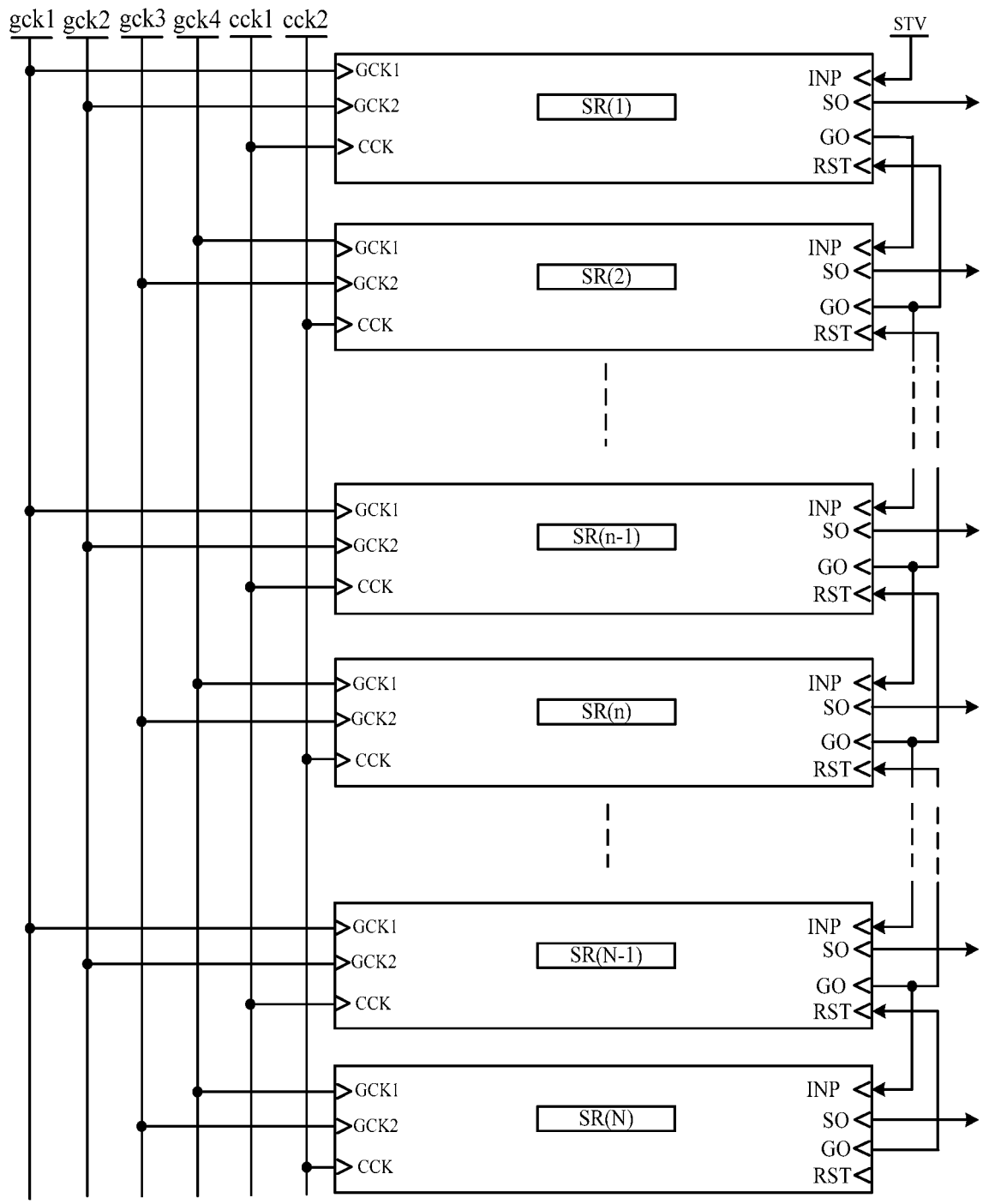
FIG. 6 is a schematic structural diagram of a drive circuit according to an embodiment of the present disclosure.

A drive circuit according to embodiments of the present disclosure, as shown in FIG. 6, may include: a plurality of cascaded shift register units: e.g., shift register units SR(1), SR(2) . . . SR(n−1), SR(n) . . . SR(N−1), SR(N) (for a total of N shift register units, 1≤n≤N, n being an integer); the input signal end INP of a first-stage shift register unit SR(1) is electrically connected to a frame trigger signal end; and in adjacent two-stage shift register units, the input signal end INP of a lower-stage shift register unit SR(n) is electrically connected to the cascade output end GO of a upper-stage shift register unit SR(n−1), and the reset signal end RST of the upper-stage shift register unit SR(n−1) is electrically connected to the cascade output end GO of the lower-stage shift register unit SR(n).

The specific structure of each shift register unit in the drive circuit described above is the same in function and structure as the shift register unit described above in this disclosure, and the repetitions will not be repeated. The drive circuit may be configured in a liquid crystal display apparatus or may be configured in an electroluminescent display apparatus, which is not limited here.

In the above drive circuit according to an embodiment of the present disclosure, the first reference signal ends VREF1VREF1 of the shift register units SR(n) at all stages are each coupled to the same DC signal end vss, and the second reference signal ends VREF2VREF2 of the shift register units SR(n) at all stages are each coupled to the same DC signal end vdd.

In the above drive circuit according to an embodiment of the present disclosure, as shown in FIG. 6, first cascade clock signal ends GCK1GCK1 of the 2k−1 stage shift register units are coupled to the same clock end, i.e., the first clock end gck1. Second cascade clock signal ends GCK2 of the 2k−1 stage shift register units are coupled to the same clock end, i.e., the second clock end gck2. First cascade clock signal ends GCK1GCK1 of the 2k stage shift registers are coupled to the same clock end, i.e., the fourth clock end gck4. Second cascade clock signal ends GCK2 of the 2k stage shift registers are coupled to the same clock end, i.e., the third clock end gck3, where k is a positive integer.

In the above drive circuit according to an embodiment of the present disclosure, as shown in FIG. 6, control clock signal ends CCK of the 2k−1 stage shift register units are each electrically connected to the cck1 end, and control clock signal ends CCK of the 2k stage shift register units are each electrically connected to the cck2 end.

An embodiment of the present disclosure further provides a display apparatus including the above-described drive circuit. The principle of solving the problem by the display apparatus is similar to that of the aforementioned shift register unit, so the implementation of the display apparatus may be referred to the implementation of the aforementioned shift register unit, and the repetitions will not be repeated.

In specific implementation, the display apparatus may include a plurality of pixel cells, a plurality of gate lines and data lines, and each pixel cell may include a plurality of sub-pixels, such as a red sub-pixel, a green sub-pixel, and a blue sub-pixel. The above-described display apparatus provided in an embodiment of the present disclosure may be an organic light-emitting display apparatus or may be a liquid crystal display apparatus, which is not limited here.

Figure 7:
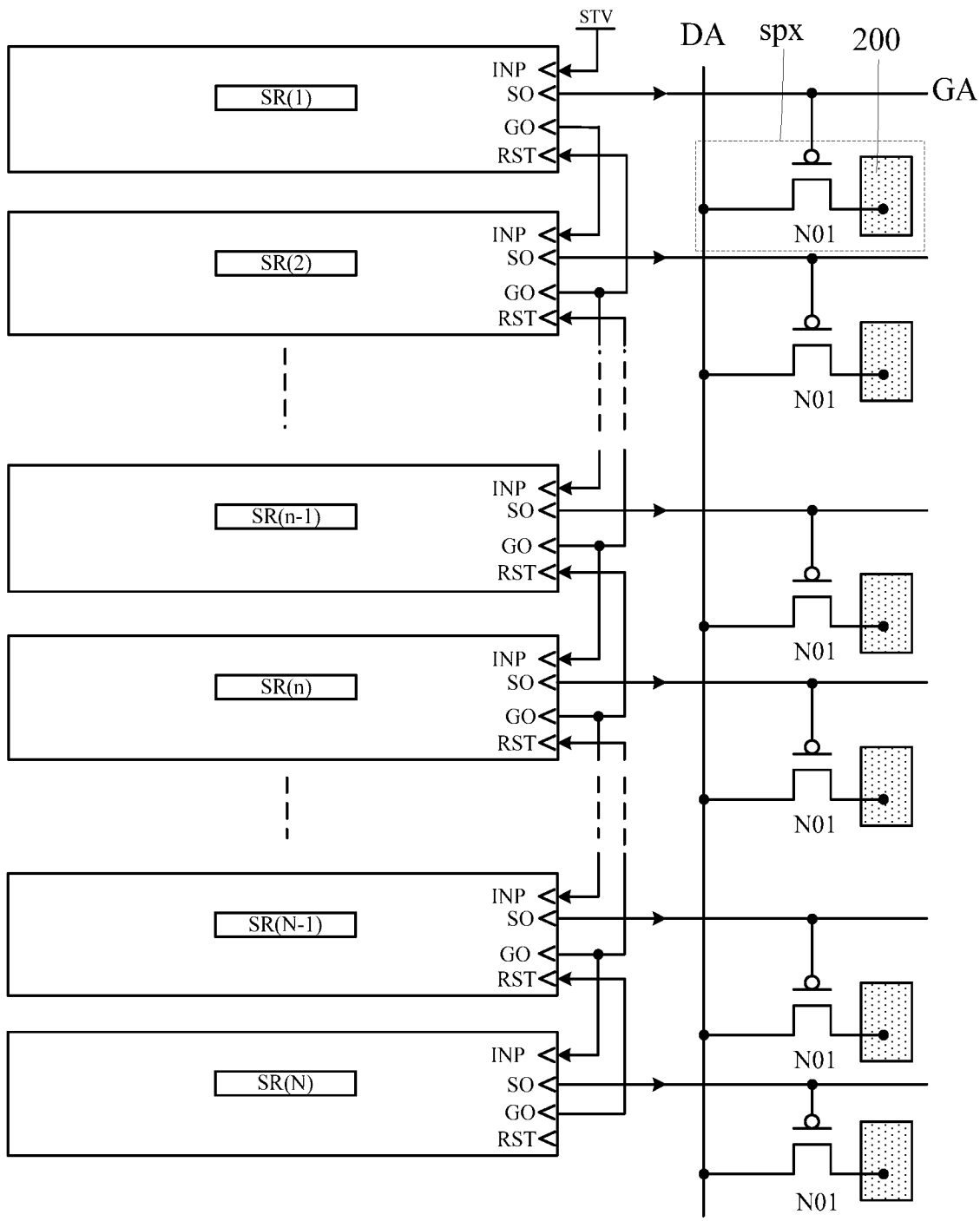
FIG. 7 is a schematic structural diagram of a display apparatus according to an embodiment of the present disclosure.

In the display apparatus, as illustrated in FIG. 7, one row of sub-pixels spx is electrically connected to one gate line GA, and one column of sub-pixels spx is electrically connected to one data line DA. The sub-pixel spx may include a scan transistor N01 and a pixel electrode 200. A gate of the scan transistor N01 may be electrically connected to the gate line GA, a source of the scan transistor N01 may be electrically connected to the data line DA, and a drain of the scan transistor N01 may be electrically connected to the pixel electrode 200. One gate line GA is electrically connected to a drive output end SOSO of one shift register unit in the drive circuit. In this way, the drive output end SOSO of the shift register unit provides a signal to the gate of the scan transistor N01 in the sub-pixel, and the cascade output end GOGO of the shift register unit transmits an activation signal for the lower-stage shift register unit. In this way, when the above-described display apparatus provided in an embodiment of the present disclosure is a liquid crystal display apparatus, the above-described drive circuit may be used as a gate drive circuit for providing a gate scan signal for the scan transistor N01. It should be noted that the scan transistor N01 may be a P-type transistor and is turned on under the control of a low-level signal transmitted on the gate line and is turned off under the control of a high-level signal transmitted on the gate line. Alternatively, the scan transistor N01 may be an N-type transistor and is turned on under the control of a high-level signal transmitted on the gate line and is turned off under the control of a low-level signal transmitted on the gate line.

Figure 8:
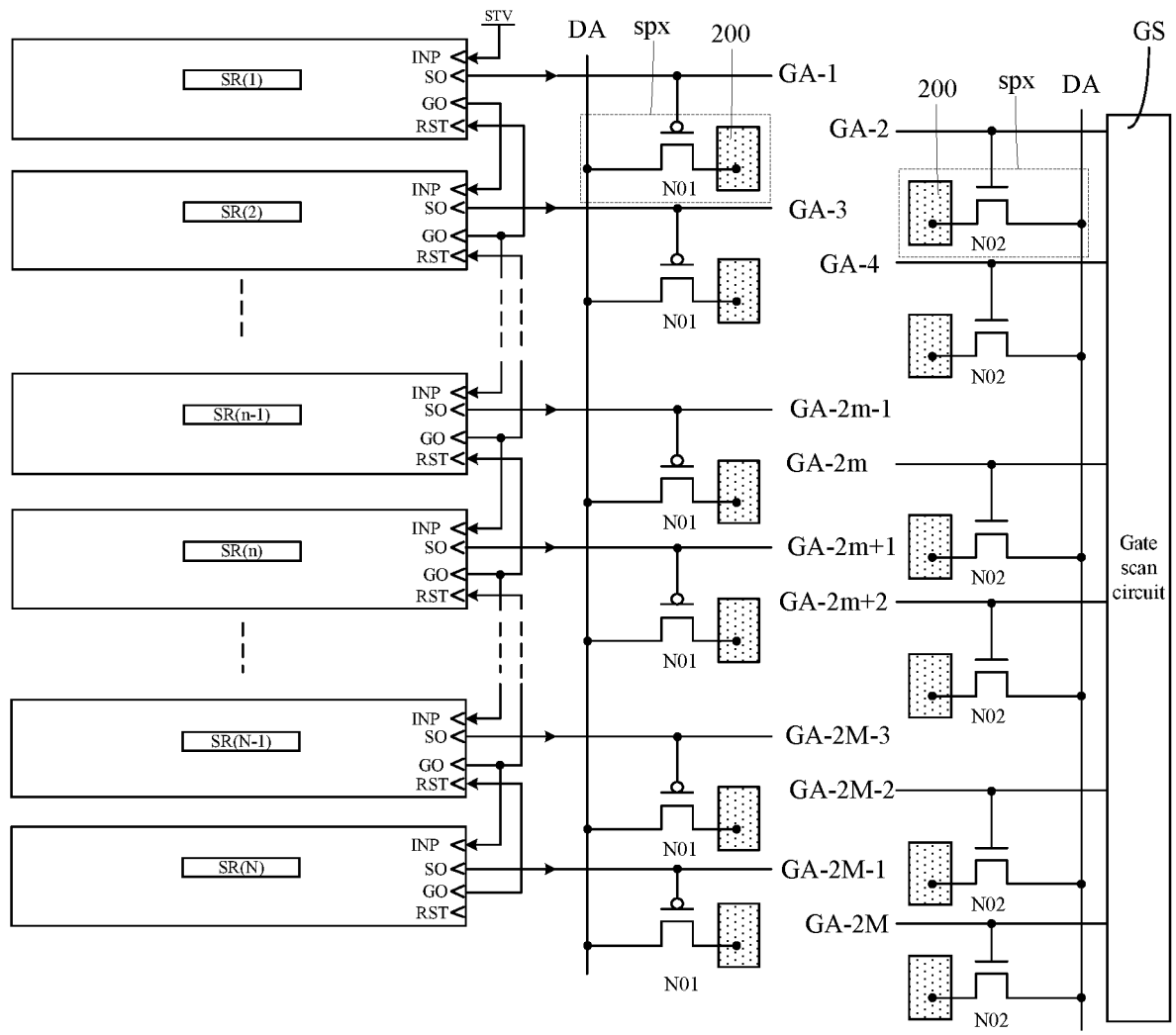
FIG. 8 is another schematic structural diagram of the display apparatus according to an embodiment of the present disclosure.
Figure 9:
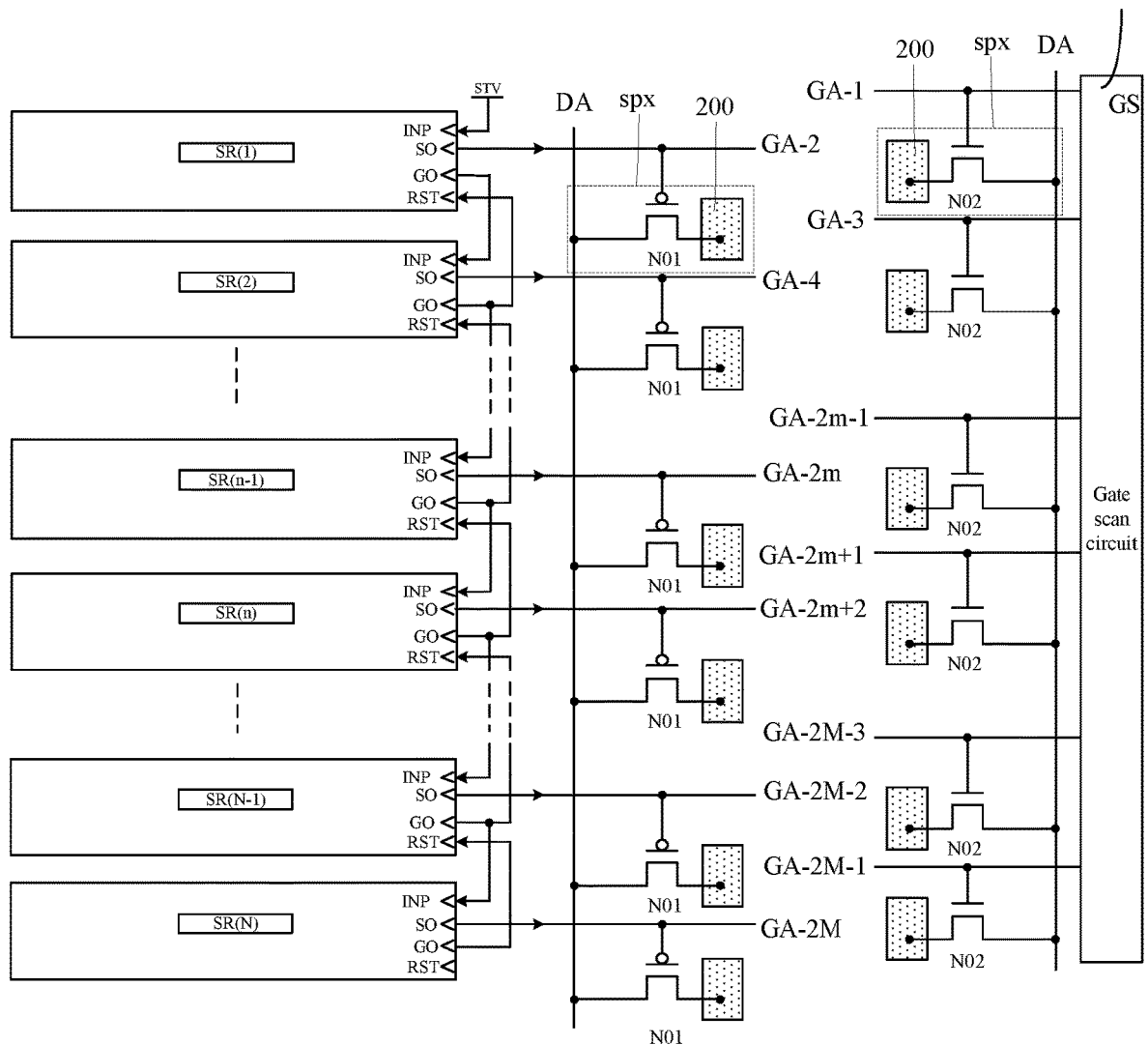
FIG. 9 is yet another schematic structural diagram of the display apparatus according to an embodiment of the present disclosure.

Further, two transistors of different types may be provided in different sub-pixels. As illustrated in FIGS. 8 and 9, the display apparatus may further include a gate scan circuit. The drive circuit is electrically connected to gate lines spaced apart by one gate line, and the gate scan circuit is electrically connected to remaining gate lines. For example, as shown in FIG. 8, the display apparatus may include a plurality of gate lines GA-1, GA-2, GA-3, GA-4, . . . GA-2m, . . . GA-2M, one row of sub-pixels is electrically connected to one gate line, where m and M are integers, and 1≤m≤M. The transistors N01 in the sub-pixels to which odd rows of gate lines (e.g. GA-1, GA-3, . . . GA-2m−1, . . . GA-2M−11) are electrically connected are P-type transistors, and the transistors N02 in the sub-pixels to which even rows of gate lines (e.g. GA-2, GA-4, . . . GA-2m, . . . GA-2M) are electrically connected are N-type transistors. The odd rows of gate lines (e.g. GA-1, GA-3, . . . GA-2m−1, . . . GA-2M−11) may be electrically connected to the drive circuit, and the drive output end SO of one shift register unit in the drive circuit is electrically connected to one of the odd rows of gate lines (e.g. GA-1, GA-3, . . . GA-2m−1, . . . GA-2M−11). The even rows of gate lines (e.g., GA-2, GA-4, . . . GA-2m, . . . GA-2M) may be electrically connected to the gate scan circuit, and the gate scan circuit can include a plurality of cascaded shift registers, and an output of one shift register in the gate scan circuit may be electrically connected to one of the even rows of gate lines (e.g., GA-2, GA-4, . . . GA-2m, . . . GA-2M).

Alternatively, as illustrated in FIG. 9, the transistors N02 in the sub-pixels to which the odd rows of gate lines (e.g., GA-1, GA-3, . . . GA-2m−1, . . . GA-2M−11) are electrically connected are N-type transistors, and the transistors N02 in the sub-pixels to which the even rows of gate lines (e.g., GA-2, GA-4, . . . GA-2m, . . . GA-2M) are electrically connected are P-type transistors. The odd rows of gate lines (e.g. GA-1, GA-3, . . . GA-2m−1, . . . GA-2M−11) may be electrically connected to the gate scan circuit, and an output end of one shift register in the gate scan circuit is electrically connected to one of the odd rows of gate lines (e.g. GA-1, GA-3, . . . GA-2m−1, . . . GA-2M−11). The even rows of gate lines (e.g. GA-2, GA-4, . . . GA-2m, . . . GA-2M) may be electrically connected to the drive circuit, and the drive output end SO of one shift register unit in the drive circuit may be electrically connected to one of the even rows of gate lines (e.g. GA-2, GA-4, . . . GA-2m, . . . GA-2M).

Figure 10:
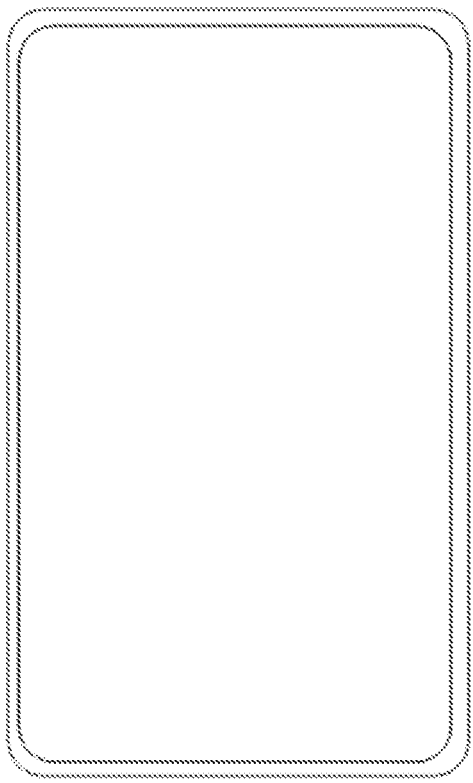
FIG. 10 is yet another schematic structural diagram of the display apparatus according to an embodiment of the present disclosure.

In specific implementation, the above-described display apparatus according to an embodiment of the present disclosure may be a cell phone as shown in FIG. 10. Of course, the above-described display apparatus according to the present embodiment may be any product or component having a display function, such as a tablet computer, a television set, a display, a laptop computer, a digital photo frame, a navigator, or the like. Other essential components to the display apparatus will be understood to have by those of ordinary skill in the art and will not be described herein and should not be taken as a limitation on the present disclosure.

Although embodiments of the present disclosure have been described, additional changes and modifications may be made to these embodiments once the basic inventive concepts are known to those skilled in the art. Therefore, the appended claims are intended to be interpreted to encompass embodiments as well as all changes and modifications falling within the scope of the present disclosure.

It will be apparent to those skilled in the art that various modifications and variations may be made to embodiments of the disclosure without departing from the spirit and scope of embodiments of the disclosure. Thus the disclosure is also intended to encompass such modifications and variations of embodiments of the disclosure to the extent that they fall within the scope of the claims of the disclosure and their equivalents.

What is claimed is:

1. A shift register unit, comprising:
   a control circuit, electrically connected to an input signal end, a reset signal end, a first control signal end, a second control signal end, a first reference signal end, a first node, and a second node respectively, and configured to adjust a signal of the first node and a signal of the second node according to the input signal end, the first control signal end, the second control signal end, and the first reference signal end;
   a cascade circuit, electrically connected to a first cascade clock signal end, the first node, and a cascade output end respectively, and configured to provide a signal of the first cascade clock signal end to the cascade output end according to the signal of the first node; and
   an output circuit, electrically connected to a control clock signal end, the first node, the second node, a second reference signal end, and a drive output end respectively, and configured to provide a signal of the control clock signal end to the drive output end according to the signal of the first node, and to provide a signal of the second reference signal end to the drive output end according to the signal of the second node.

2. The shift register unit according to claim 1, wherein the output circuit comprises: a first transistor and a second transistor;
   a gate of the first transistor is electrically connected to the first node, a first end of the first transistor is electrically connected to the control clock signal end, and a second end of the first transistor is electrically connected to the drive output end; and
   a gate of the second transistor is electrically connected to the second node, a first end of the second transistor is electrically connected to the second reference signal end, and a second end of the second transistor is electrically connected to the drive output end.

3. The shift register unit according to claim 2, wherein the output circuit further comprises: a third transistor and a fourth transistor;
   a gate of the third transistor is electrically connected to a regulation signal end, a first end of the third transistor is electrically connected to the second end of the first transistor, and a second end of the third transistor is electrically connected to the drive output end; and
   a gate of the fourth transistor is electrically connected to the regulation signal end, a first end of the fourth transistor is electrically connected to the second end of the second transistor, and a second end of the fourth transistor is electrically connected to the drive output end.

4. The shift register unit according to claim 1, wherein the cascade circuit comprises: a fifth transistor and a storage capacitor;
   a gate of the fifth transistor is electrically connected to the first node, a first end of the fifth transistor is electrically connected to the first cascade clock signal end, a second end of the fifth transistor is electrically connected to the cascade output end; and
   a first end of the storage capacitor is electrically connected to the first node, and the storage capacitor is electrically connected to the cascade output end.

5. The shift register unit according to claim 1, wherein the shift register unit further comprises: a sixth transistor;
   a gate of the sixth transistor is electrically connected to the drive output end, a first end of the sixth transistor is electrically connected to the first reference signal end, and a second end of the sixth transistor is electrically connected to the second node.

6. The shift register unit according to claim 1, wherein the control circuit comprises:
   an input circuit, electrically connected to the input signal end, the first control signal end, and an intermediate node respectively, and configured to provide a signal of the first control signal end to the intermediate node under control of a signal of the input signal end;
   a reset circuit, electrically connected to the reset signal end, the second control signal end, and the intermediate node respectively, and configured to provide a signal of the second control signal end to the intermediate node under control of a signal of the reset signal end;
   a node adjustment circuit, electrically connected to the first reference signal end, a second cascade clock signal end, the second node, and the intermediate node respectively, and configured to provide a signal of the first reference signal end to the second node under control of a signal of the intermediate node, and to provide the signal of the first reference signal end to the intermediate node under control of a signal of the second cascade clock signal end and the signal of the second node; and
   a stabilization circuit, electrically connected to the intermediate node, the first node, and a regulation signal end respectively, and configured to conduct the intermediate node and the first node under control of a signal of a regulation signal end.

7. The shift register unit according to claim 6, wherein the input circuit comprises: a seventh transistor;
   a gate of the seventh transistor is electrically connected to the input signal end, a first end of the seventh transistor is electrically connected to the first control signal end, and a second end of the seventh transistor is electrically connected to the intermediate node.

8. The shift register unit according to claim 6, wherein the reset circuit comprises: an eighth transistor;
   a gate of the eighth transistor is electrically connected to the reset signal end, a first end of the eighth transistor is electrically connected to the second control signal end, and a second end of the eighth transistor is electrically connected to the intermediate node.

9. The shift register unit according to claim 6, wherein the node adjustment circuit comprises: a ninth transistor, a tenth transistor, an eleventh transistor, and a stabilizing capacitor;
- a gate of the ninth transistor is electrically connected to the intermediate node, a first end of the ninth transistor is electrically connected to the first reference signal end, and a second end of the ninth transistor is electrically connected to the second node;
- a gate and a first end of the tenth transistor are both electrically connected to the second cascade clock signal end, and a second end of the tenth transistor is electrically connected to the second node;
- a gate of the eleventh transistor is electrically connected to the second node, a first end of the eleventh transistor is electrically connected to the first reference signal end, and a second end of the eleventh transistor is electrically connected to the intermediate node; and
- a first end of the stabilizing capacitor is electrically connected to the second node and a second end of the stabilizing capacitor is electrically connected to the first reference signal end.

10. The shift register unit according to claim 6, wherein the stabilization circuit comprises: a twelfth transistor;
- a gate of the twelfth transistor is electrically connected to the regulation signal end, a first end of the twelfth transistor is electrically connected to the intermediate node, and a second end of the twelfth transistor is electrically connected to the first node.

11. The shift register unit according to claim 1, wherein the shift register unit further comprises: a thirteenth transistor and a fourteenth transistor;
- a gate of the thirteenth transistor is electrically connected to a frame reset signal end, a first end of the thirteenth transistor is electrically connected to the first reference signal end, and a second end of the thirteenth transistor is electrically connected to an intermediate node; and
- a gate of the fourteenth transistor is electrically connected to a touch control end, a first end of the fourteenth transistor is electrically connected to the second reference signal end, and a second end of the fourteenth transistor is electrically connected to the drive output end.

12. A drive circuit, comprising: a plurality of cascaded shift register units according to claim 1;
- an input signal end of a first-stage shift register unit is electrically connected to a frame trigger signal end; and
- in adjacent two-stage shift register units, an input signal end of a lower-stage shift register unit is electrically connected to a cascade output end of an upper-stage shift register unit, and a reset signal end of the upper-stage shift register unit is electrically connected to a cascade output end of the lower-stage shift register unit.

13. A display apparatus, comprising the drive circuit according to claim 12.

14. The display apparatus according to claim 13, wherein the display apparatus further comprises: a plurality of gate lines; and
- one of the gate lines is electrically connected to a drive output end of one of the shift register units in the drive circuit.

15. The display apparatus according to claim 13, wherein the display apparatus further comprises: a plurality of gate lines and a gate scan circuit; and
- the drive circuit is electrically connected to gate lines spaced apart by one gate line, and the gate scan circuit is electrically connected to remaining gate lines.

* * * * *